United States Patent
Gau

[11] Patent Number: 6,040,232
[45] Date of Patent: Mar. 21, 2000

[54] METHOD OF MANUFACTURING SHALLOW TRENCH ISOLATION

[75] Inventor: Jing-Horng Gau, Nan-Tou Hsien, Taiwan

[73] Assignee: United Semiconductor Corp., Hsinchu, Taiwan

[21] Appl. No.: 09/236,955

[22] Filed: Jan. 25, 1999

[30] Foreign Application Priority Data

Nov. 6, 1998 [TW] Taiwan ................................. 87118504

[51] Int. Cl.⁷ .................................................. H01L 21/76
[52] U.S. Cl. .......................... 438/424; 221/421; 221/703; 221/713; 221/978
[58] Field of Search .................... 438/424, 221, 438/421, 701, 713, 978

[56] References Cited

U.S. PATENT DOCUMENTS

| | | | |
|---|---|---|---|
| 5,258,332 | 11/1993 | Horioka et al. | 438/424 |
| 5,578,518 | 11/1996 | Koike et al. | 438/424 |
| 5,712,185 | 1/1998 | Tsai | 438/424 |
| 5,719,085 | 2/1998 | Moon et al. | 438/424 |
| 5,780,346 | 7/1998 | Arghavani et al. | 438/434 |
| 5,837,612 | 8/1997 | Ajuria et al. | 438/424 |
| 5,880,004 | 6/1997 | Ho | 438/424 |

*Primary Examiner*—Charles Bowers
*Assistant Examiner*—David S Blum
*Attorney, Agent, or Firm*—Jiawei Huang; J.C. Patents

[57] ABSTRACT

A method is described for manufacturing shallow trench isolation. The method comprises the steps of providing a substrate having a pad oxide layer, a mask layer, a trench penetrating through the mask layer and the pad oxide and into the substrate and a first liner oxide layer in the trench. A portion of the first liner oxide layer is stripped away to expose the bottom corner of the mask layer. A portion of the mask layer is stripped away to expose the top corner of the first oxide layer. The first liner oxide layer is removed to expose the surface of the trench. A second liner oxide layer is formed on the sidewall and the base surface of the trench and the trench is filled with an insulating material to form a shallow trench isolation.

11 Claims, 5 Drawing Sheets

METHOD OF MANUFACTURING SHALLOW TRENCH ISOLATION

CROSS-REFERENCE TO RELATED APPLICATION

This application claims the priority benefit of Taiwan application Ser. No. 87118504, filed Nov. 6, 1998, the full disclosure of which is incorporated herein by reference.

BACKGROUND OF THE INVENTION

1. Field of the Invention

The present invention relates to a method of manufacturing a semiconductor device. More particularly, the present invention relates to a method of manufacturing a shallow trench isolation.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs. Conventionally, the local oxidation of silicon (LOCOS) technique is widely utilized in semiconductor industry to provide isolation regions among the various devices in the substrate. Since the LOCOS technique has been used for quite a period of time, it is of the most reliable and low-cost methods for fabricating device isolation region. However, there are still some drawbacks to LOCOS. The drawbacks include internal stress generation and bird's beak encroachment. For a highly integrated device, the problem of bird's beak encroachment by isolation regions is especially difficult to avoid; thus the isolation regions cannot effectively isolate devices.

Shallow trench isolation (STI) technique is the other conventional method of forming isolation regions. Shallow trench isolation is formed by first anisotropically etching to form a trench in the substrate, and then depositing an oxide layer in the trench and on the substrate. Next, a chemical-mechanical polishing step is used to planarize the oxide layer and to form an STI region. Therefore, the problem induced by the bird's beak can be overcome. As line width becomes smaller and integration becomes higher, STI is an ideal and scaleable isolation technique.

FIGS. 1A through 1D are schematic, cross-sectional views of the conventional process for manufacturing STI.

As shown in FIG. 1A, a pad oxide layer 102 and a silicon nitride layer 104 are formed over the substrate 100 in sequence. A trench 106 is formed in the substrate 100 by patterning the silicon nitride layer 104, the pad oxide layer 102 and the substrate 100.

As shown in FIG. 1B, a liner oxide 108 is formed on the sidewall and the base surface of the trench 106.

In FIG. 1C, a silicon oxide layer (not shown) is formed over the substrate 100 and fills the trench 108. Chemical-mechanical polishing is used to planarize the silicon oxide layer until the silicon nitride layer is exposed and an STI I 18 is formed.

As shown in FIG. 1D, the silicon nitride layer 104 and the pad oxide layer 102 are stripped away to expose the surface of the substrate 100.

Since the materials of the STI 118 and the pad oxide layer 102 are the same, a portion of the exposed portion of the STI 118 is stripped away while the pad oxide layer 102 is being stripping away. Therefore, portions of the sidewall and the top face of the STI 118 are stripped away and a recess 120 is present in the STI 118 at the top corner 110 of the trench 106. The recess 120 leads to a kink effect of the FETs. Moreover, when the gate structure is subsequently formed over the substrate 100, some gate material is usually left in the recess 120. In order to avoid the leakage caused by the residual gate material in the recess 120, it is necessary to perform an over-etching step to clean the residues from the recess 120.

SUMMARY OF THE INVENTION

It is therefore an objective of the invention to provide a method of manufacturing a shallow trench isolation to overcome the problems induced by the recess in the shallow trench at the top corner of the trench.

To achieve these and other advantages and in accordance with the purpose of the invention, as embodied and broadly described herein, the invention provides a method of manufacturing a shallow trench isolation. The method comprises the steps of providing a substrate having a pad oxide layer, a mask layer, a trench penetrating through the mask layer and the pad oxide and into the substrate, and a first liner oxide layer in the trench. A portion of the first liner oxide layer is stripped away to expose the bottom corner of the mask layer. A portion of the mask layer is stripped away to expose the top corner of the first oxide layer. The first liner oxide layer is removed to expose the surface of the trench. A second liner oxide layer is formed on the sidewall and the base surface of the trench and the trench is filled with an insulating material to form a shallow trench isolation. Since the there is no recess in the shallow trench isolation at the top corner of the trench, the kink effect of the FETs can be avoided, and the leakage problem induced by the residues formed in the subsequent procedure of forming gate structure over the substrate can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
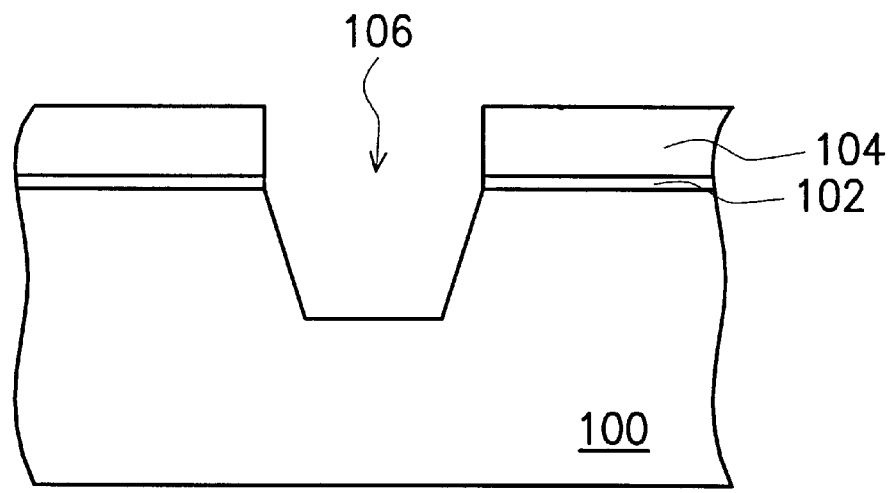
FIG. 1A through 1D are schematic, cross-sectional views of the conventional process for manufacturing STI.
Figure 1B:
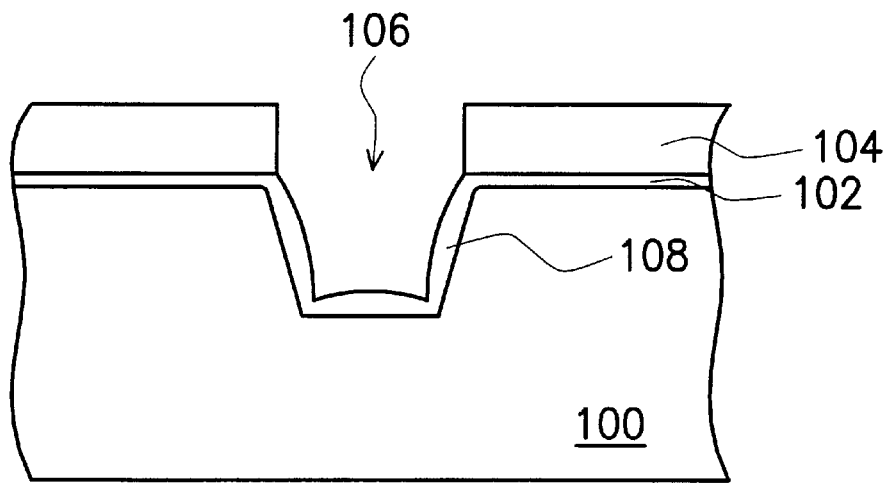
Figure 1C:
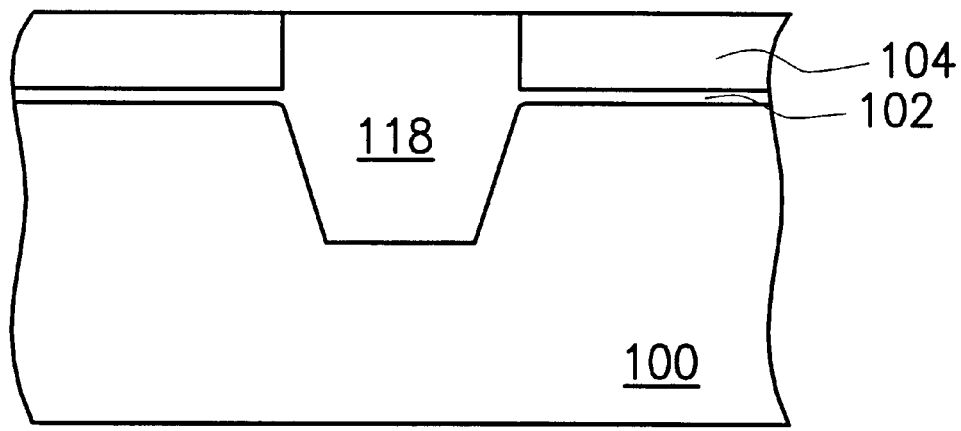
Figure 1D:
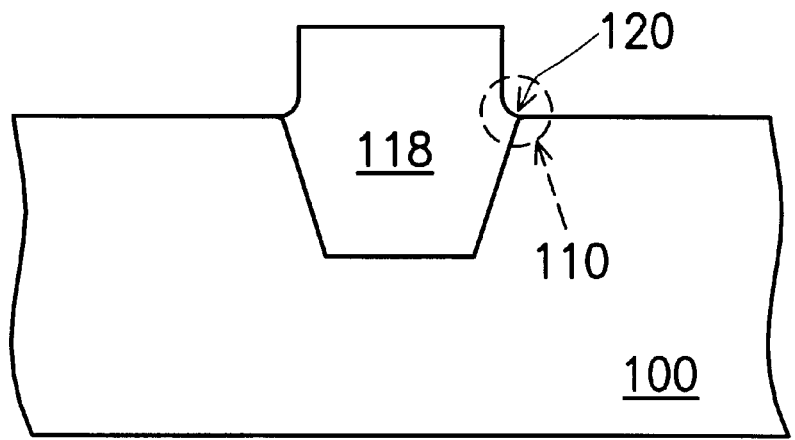

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2I are schematic, cross-sectional views of the process for manufacturing the shallow trench isolation in a preferred embodiment according to the invention.

Figure 2A:
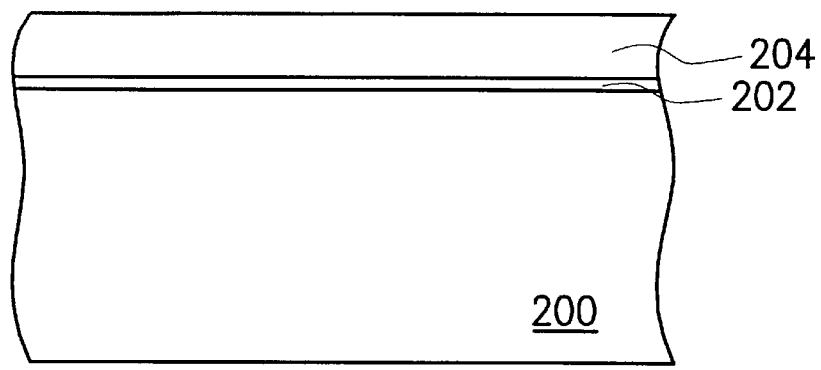
FIGS. 2A through 2I are schematic, cross-sectional views of the process for manufacturing the shallow trench isolation in a preferred embodiment according to the invention.

First, as shown in FIG. 2A, a pad oxide layer 202 and a mask layer 204 are formed over the substrate 200 in sequence. The method of forming the pad oxide layer 202 can be thermal oxidation, for example. The mask layer 204 can be a silicon nitride layer formed by low-pressure chemical vapor deposition (LPCVD), for example.

Figure 2B:
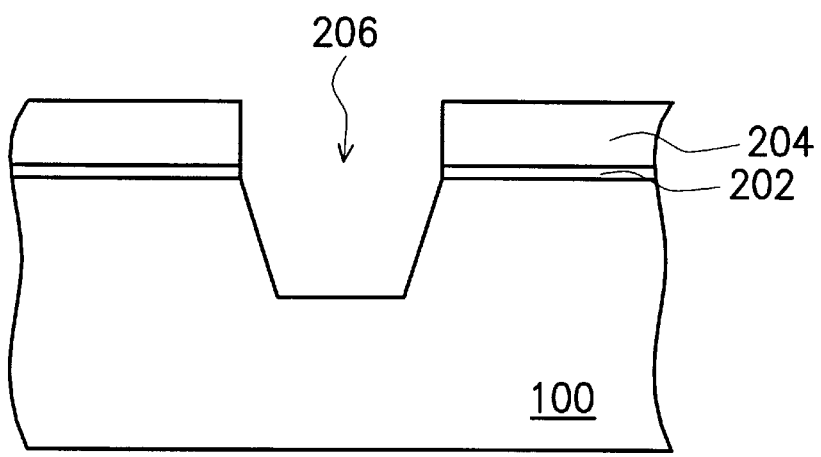

As shown in FIG. 2B, a trench 206 is formed in the substrate 200. In this example, the method for forming the trench 206 comprises the steps of performing a photolithography step to define the range of the predetermined trench. Portions of the mask layer 204, the pad oxide layer 202 and the substrate 200 are removed to form the trench 206 in the substrate 200 by anisotropic etching. When the material of the mask layer 204 is silicon nitride, the preferred anisotropic etching plasma for etching the mask layer 204 includes $CH_3F$ plasma, $CHF_3$ plasma or $NF_3$ plasma. Additionally, the anisotropic etching plasma for etching the pad oxide layer 202 includes $CH_4$ plasma.

Figure 2C:
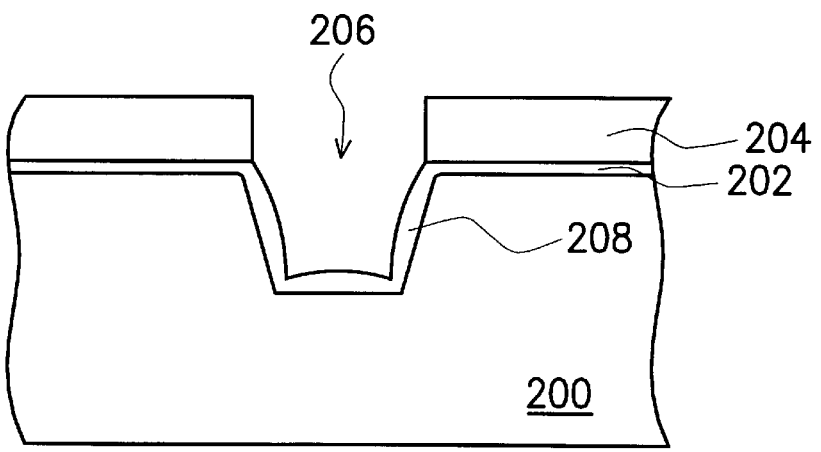

As shown in FIG. 2C, a liner oxide layer 208 is formed on the sidewall and the base surface of the trench 206. The method of forming the liner oxide layer 208 can be thermal oxidation, for example. Preferably, the thickness is about 300 Å. Preferably, the surface of the sidewall of the mask layer 204 exposed by the trench 206 is not covered by the liner oxide layer 208.

Figure 2D:
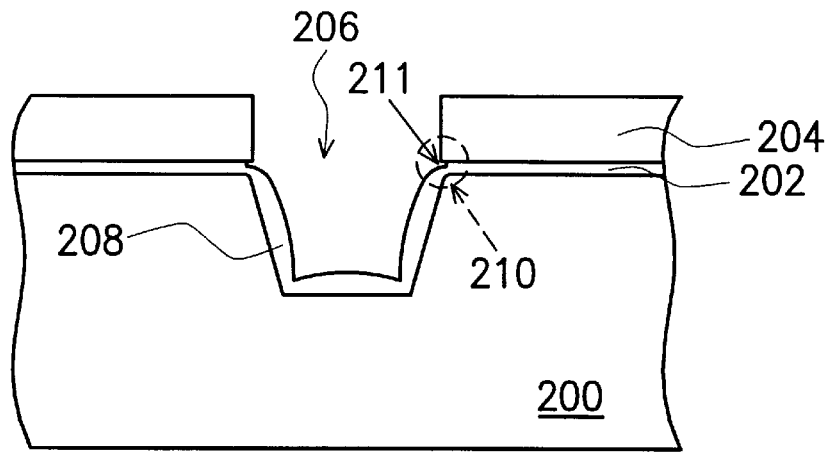

As shown in FIG. 2D, an isotropic etching step is used to strip away a portion of the liner oxide layer 208 from its outer surface by a thickness of about 200 Å. Since the portion of the liner oxide layer 208 on the top corner 210 of the trench 206 is stripped away, the bottom corner 211 of the sidewall of the mask layer 204 is exposed. The isotropic etching step for stripping the portion of the liner oxide layer 208 from its outer surface includes wet etching with HF solution or $HF/NH_4F$ buffer solution.

Figure 2E:
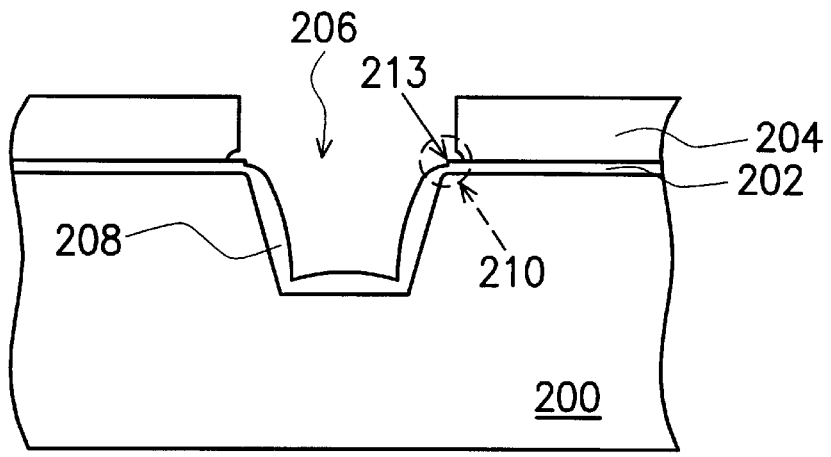

As shown in FIG. 2E, an isotropic etching step is used to strip away a portion of the mask layer 204 adjacent the top corner 210 of the trench 206. Thus, part of the bottom corner 211 is removed and the remaining part is rounded. During this process, part of the sidewall of the mask layer 204 may also be remove form its outer surface. Since the portion of the mask 204 adjacent the top corner 210 of the trench 206 is stripped away, a new top corner 213 of the residual liner oxide layer 208 is exposed, which is adjacent to the top corner 210, but further away from the trench. The isotropic etching step for stripping the portion of the mask layer 204 includes wet etching. When the material of the mask layer 204 is silicon nitride, the preferred wet etching solution is hot phosphoric acid.

Figure 2F:
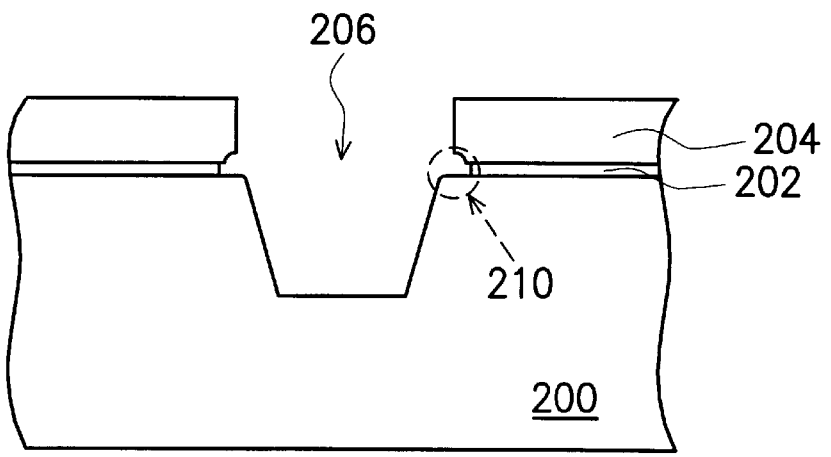

As shown in FIG. 2F, the residual liner oxide layer 208 and a portion of the pad oxide layer 202 are removed to expose the surface of the trench 206. Since the liner oxide 208 had been formed on the sidewall and the base surface of the trench 206, and a portion of the mask layer 204 adjacent the top corner 210 has been stripped, the bottom corner of the mask layer 204 adjacent the top corner 210 of the trench 206 is rounded. The method of removing the residual liner oxide layer 208 includes wet etching with HF solution or $HF/NH_4F$ buffer solution.

Figure 2G:
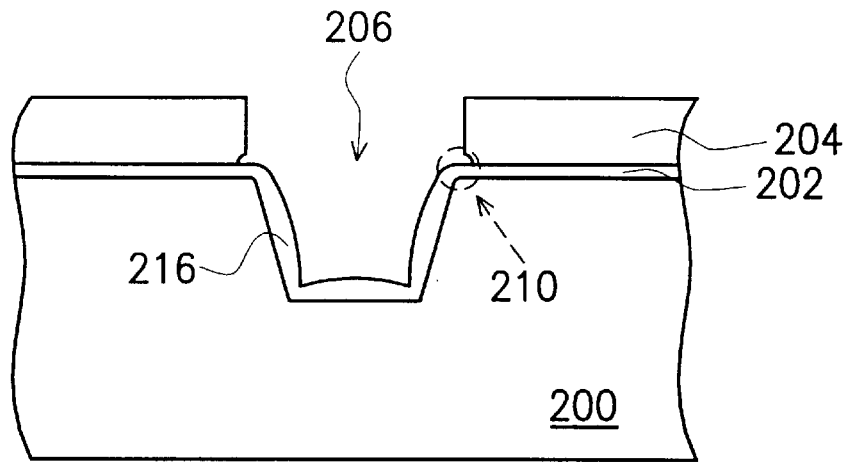

As shown in FIG. 2G, a liner oxide layer 216 is formed on the sidewall and the base surface of the trench 206. The method of forming the liner oxide layer 216 can be thermal oxidation, for example. Generally, in order to reduce the stress between the liner oxide layer 216 and the mask layer 204, a thick liner oxide layer is commonly formed to round out the top corner of the trench 206. Because the top corner 210 of the trench 206 is round, it is unnecessary to form a thick liner oxide layer in the invention. The thickness of the liner oxide layer 216 is about 100–200 Å, and the preferred thickness is about 150–200 Å. Moreover, the thickness of the liner oxide layer 216 is thin, so that the size of the opening of the trench 206 is large and it is easy to fill the trench 206 with insulating material. Furthermore, if any defects are formed at the sidewall of the trench 206 while the trench 206 is formed, these defects are removed when the liner oxide layer 208 is removed. Thus, the probability of leakage is reduced.

Figure 2H:
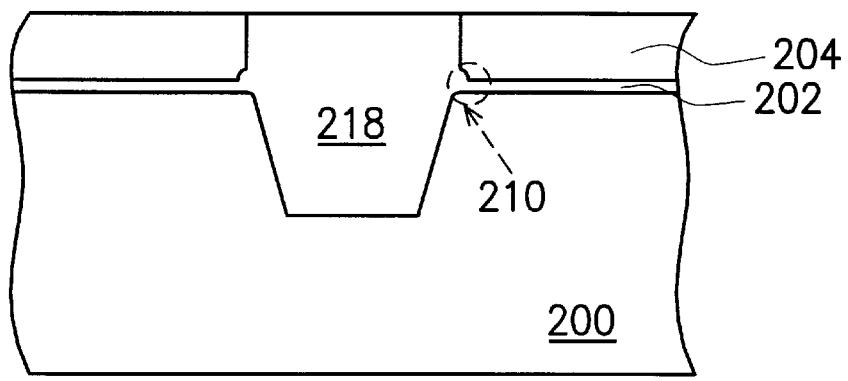

As shown in FIG. 2H, the trench 206 is filled with insulating material. The insulating material can be silicon oxide, and the method of filling the trench 206 with insulating material can be chemical vapor deposition (CVD). A planarizing step such as chemical-mechanical polishing (CMP) is used to make the insulating material surface level with the mask layer 204 and to form a STI 218. The STI 218 is composed by the liner oxide layer 216 (as shown in FIG. 2G)and the insulating material.

Figure 2I:
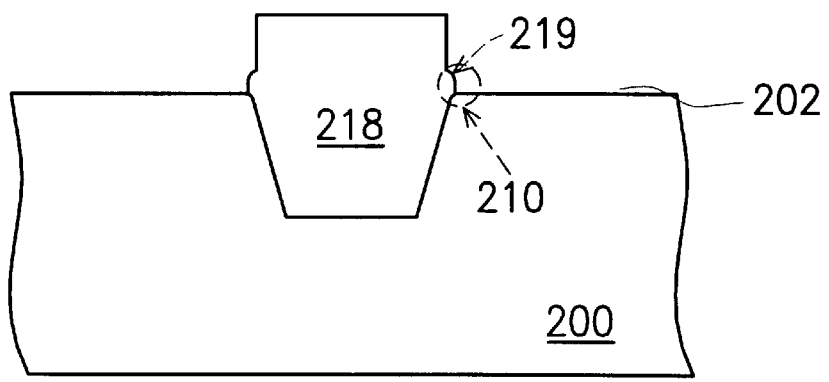

As shown in FIG. 2I, the mask layer 204 and the pad oxide layer 202 are removed in sequence until the surface of the substrate 200 and the sidewall of the STI 218 are exposed. The method for removing the mask layer 204 can be wet etching, for example. When the material of the mask layer 204 is silicon nitride the preferred wet etching solution is hot phosphoric acid. The method for removing the pad oxide layer 202 can be wet etching with HF solution or $HF/NH_4F$ buffer solution, for example. Since the protuberance 219 of the STI protuberates from the STI 218 at the top corner 210 of the trench 206, the unusual subthreshold current caused by the kink effect of the FETs can be avoided.

The present invention has the following advantages:
1. In the invention, there is no recess in the shallow trench isolation at the top corner of the trench, so that the unusual subthreshold current caused by the kink effect of the FETs can be avoided.
2. In the invention, since there is no recess in the shallow trench isolation at the top corner of the trench, the leakage problem induced by the residues formed in the subsequent procedure of forming gate structure over the substrate can be overcome.
3. In the invention, defects are formed at the sidewall of the trench while the trench 206 is formed, and the defects are removed when the liner oxide layer 208 is removed. Thus, the probability of leakage is reduced.
4. In the invention, the thickness of the liner oxide layer 216 is thin and the size of the opening of the trench is large, and it is therefore easy to fill the trench with insulating material. Additionally, since the top corner of the trench is round, the effect of the local stress and electrical field can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a shallow trench isolation suitable for a substrate having a pad oxide layer and a mask layer in sequence, a trench penetrating through the mask layer and the pad oxide layer and into the substrate defining a sidewall of the mask layer, a sidewall of the pad oxide layer and exposed surface of the substrate, and a first liner oxide layer covering the sidewall of the pad oxide layer and the exposed surface of the substrate, the method comprising the steps of:

stripping away a portion of the first liner oxide layer to expose a bottom corner of the sidewall of the mask layer;

stripping away a portion of the mask layer from its sidewall and bottom corner to expose a top corner of the first oxide layer adjacent and connected to the sidewall of the pad oxide layer;

removing the first liner oxide layer;

forming a second liner oxide layer on the sidewall and the base surface of the trench; and filling the trench with an insulating material to form a shallow trench isolation.

2. The method of claim 1, wherein the step of stripping away a portion of the first liner oxide layer includes wet etching.

3. The method of claim 2, wherein the wet etching uses HF solution.

4. The method of claim 2, wherein the wet etching uses HF/NH$_4$F buffer solution.

5. The method of claim 1, wherein the step of stripping away a portion of the mask layer includes a wet etching.

6. The method of claim 5, wherein the wet etching uses hot phosphoric acid.

7. The method of claim 1, wherein the step of removing the first liner oxide layer includes wet etching.

8. The method of claim 7, wherein the wet etching uses HF solution.

9. The method of claim 8, wherein the wet etching uses HF/NH$_4$F buffer solution.

10. The method of claim 1, wherein the step of forming the second liner oxide layer includes thermal oxidation.

11. The method of claim 1, wherein the insulating material includes silicon nitride.

* * * * *